United States Patent [19]

Chouly et al.

[11] Patent Number: 5,307,377
[45] Date of Patent: Apr. 26, 1994

[54] SYSTEM FOR MODULATING/DEMODULATING DIGITAL SIGNALS TRANSMITTED WITH ENCODED MODULATION

[75] Inventors: Antoine Chouly, Paris; Khaled Fazel, Vincennes, both of France

[73] Assignee: U.S. Philips Corporation, New York, N.Y.

[21] Appl. No.: 774,761

[22] Filed: Oct. 8, 1991

[30] Foreign Application Priority Data

Oct. 9, 1990 [FR] France ................ 90 12417

[51] Int. Cl.⁵ .................................... H04L 5/12
[52] U.S. Cl. ................................ 375/39; 375/27; 375/34; 371/37.4; 371/37.8; 371/43
[58] Field of Search .................... 375/27, 34, 39, 94, 375/25; 371/2.1, 37.4, 37.5, 37.7, 43, 378, 43, 378, 37.1

[56] References Cited

U.S. PATENT DOCUMENTS

| | | | |
|---|---|---|---|
| 3,988,677 | 10/1976 | Fletcher et al. | 325/41 |
| 4,637,021 | 1/1987 | Shenton | 371/37 |
| 4,873,701 | 10/1989 | Tretter | 375/27 |
| 4,907,233 | 3/1990 | Deutsh et al. | 371/37.4 |
| 4,993,046 | 2/1991 | Saito et al. | 371/43 |
| 5,052,000 | 9/1991 | Wang et al. | 375/14 |
| 5,070,503 | 12/1991 | Shikakura | 371/2.1 |
| 5,117,427 | 5/1992 | Miyake et al. | 371/37.4 |

OTHER PUBLICATIONS

F. W. Fox et al., "Implementation of Reed-Solomon Erasure-Correcting Decoder for Hybrid Coding Scheme", IEEE Transactions on Communications Technology, vol. 19, No. 4, Aug. 1971, pp. 543-546.

"Channel Coding with Multilevel/Phase Signals", Gottfried Ungerboeck, IEEE Transactions On Information Theory, vol. IT-28, Jan., 1982, pp. 55-67.

"16-QAM and Trellis—Coded 16-QAM On Nonlinear Channels", Mark T. Lyons et al., IEEE Globecom, 1985, p. 493.

Primary Examiner—Stephen Chin
Assistant Examiner—Don N. Vo
Attorney, Agent, or Firm—Michael E. Marion

[57] ABSTRACT

Encoding and decoding devices (5, 105) influencing digital signals transmitted with encoded modulation. For the encoding a channel encoder (12) performs a code concatenation to distribute the protection redundancy bits over various symbol periods of the encoded modulation, for example, over two multiplexed 16 QAMs. A source encoder (11) may effect a reduction of the input bit rate. A differential encoder (31) may be used for the encoding so as to ensure the detection of the phase rotation invariance of the code. At the receiver end a decoding device (105) performs the corresponding operations in reverse. The invention may be used for digital signal transmission of: television, microwave, mobile radio signals, for storage on compact disc or on digital video recorder, for communication between computers.

8 Claims, 11 Drawing Sheets

SYSTEM FOR MODULATING/DEMODULATING DIGITAL SIGNALS TRANSMITTED WITH ENCODED MODULATION

BACKGROUND OF THE INVENTION

The invention relates to a system for modulating-/demodulating digital signals for transmitting these signals using encoded modulation via a transmission channel, the said system comprising an encoding device equipped with a modulator which is situated in a transmitting station and a decoding device equipped with a demodulator which is situated in a receiving station, the encoding device comprising a channel encoder which executes an encoding for protecting the digital signals by addition of binary redundancy distributed over several character-periods of the encoded modulation, the channel encoder comprising at least one internal encoder which executes an internal convolutive encoding with efficiency $R_2$ and which is combined with the modulation encoded by a binary allocation module.

It relates more particularly to the encoding device and the decoding device of the said system.

Such encoding and decoding devices find their applications in the transmission of digital signals through a transmission channel.

This may involve transmitting for example high-definition digital television signals through a satellite channel or digital signals by radio beams. It may likewise involve transmitting sound by mobile radio, or digital data in order to store them for example in a compact disc or a digital video recorder. In these cases it is necessary on transmission to execute at the source a prior reduction in throughput through a source encoder and to reestablish the throughput on reception through a source decoder. In the cases where it is desired to transmit digital data between two digital processing units, for example between two processors, this throughput reduction through a source encoder does not arise.

Since the most representative application is that relating to high-definition television (HDTV) for which the problems are most widespread, the present patent application is presented for this application without this constituting any limitation whatsoever.

The digitising of High-Definition Television (HDTV) generates a total unprocessed throughput of the order of 800 Mbits/sec. Transmission of this information at such a throughput cannot be economically realised in existing transmission channels. Several encoding techniques have been developed for reducing the throughput (source encoding). The performance of these encoding algorithms is measured in terms of their throughput "reduction factor" and of the quality of the picture restored after decoding. The more the redundancy of the signal is reduced, the more significant is the information transmitted. Possible transmission errors, which may be fairly easily corrected if the information transmitted is redundant, have increasingly serious consequences when the reduction factor increases.

In consequence, the transmitting of digital HDTV signals requires judicious protection. So as not to notice the effects of transmission errors on the screen, the channel error rate must be less than $10^{-11}$.

The channel used for "Direct Broadcast by Satellite" (DBS) is characterised by:
a bandwidth of 27 MHz,
low power (especially for the link coming from the satellite) and the presence of a strong noise signal, regarded as additive, white and Gaussian,
and nonlinear distortions.

The routing of the HDTV digital signals via such a channel demands a source encoding at a significant compression rate as well as a digital modulation with high spectral efficiency.

The techniques of source encoding, based for example on an orthogonal transformation, may reduce the throughput by a factor greater than 10 while ensuring good restored picture quality. This leads to transmitting a binary throughput of the order of 80 Mbits/s. However, the transmission of such signals on a satellite channel demands a digital modulation with spectral efficiency reaching 3 bits/s/Hz.

The conventional encoding and modulating techniques prove to be limited as regards fully meeting the demands of correct transmission. However, these techniques are substantially improved by using the encoding technique proposed by G. UNGERBOECK in the article entitled: "Channel coding with multilevel/phase signals" presented in IEEE Transactions on Information Theory vol. IT-28 No. 1, January 1982, pp. 55–67.

SUMMARY OF THE INVENTION

It is proposed to consider the channel encoding and the modulating as one entity and for this purpose to combine a channel encoding with a digital modulation. This makes it possible to enhance the efficiency of the digital transmission, and hence to improve the performance, without sacrificing spectral efficiency. The redundancy added to the encoding is transmitted by the redundancy of the alphabet instead of enhancing the data rate. This technique is based on the principle of maximising the minimum Euclidian distance between the sequences of encoded characters transmitted. More precisely it is proposed by way of example to transmit 3 bits per character by using a phase and amplitude modulation of two quadrature carriers (16 QAM).

Thus, after an encoding which transforms m information bits into p bits, with $m>p$ where $m-p$ represents the redundancy added in order to protect information upon transmission, with a $2^m$-state modulation, $2^{m-p}$ additional states are available to transmit this redundancy. This modulating technique makes it possible to perform a spatial and not temporal distribution of the redundancy.

According to the technique developed in this document, when $m=3$ bits are transmitted per character period with 1 redundancy bit added, it is possible to reach a binary error rate (BER) less than $10^{-11}$, but for this purpose it is necessary that, at the input, a signal/-noise ratio better than about 12 dB is available. The latter value remains very high in actual situations since it necessitates large-size antennas which are unsuitable for HDTV applications intended for the general public.

The document U.S. Pat. No. 4,873,701 is known describing a modem and a method for modulating-demodulating signals encoded by a trellis encoding. It describes a combination of a multidimensional encoded modulation and a convolutive internal encoding. The modem used on reception performs a Viterbi decoding. However, the spectral efficiency of 4 bits/s/Hz of this system remains insufficient.

For HDTV applications the problem which arises is therefore to determine an encoding device increasing the present performance levels. On reception, it must be possible to decode the encoded signals with an appropriate decoding device. The aim is to operate with signals delivered by reasonably sized antennae having a signal/noise ratio of the order of about 9 dB for a throughput of 81 Mbit/sec and a binary error rate less than $10^{-11}$, that is to say a high level of performance. This need for a high level of performance is likewise encountered, in part or in full, in other applications such as for example radio beams, mobile radios, storage on compact disc or on digital video recorder, and communication between digital units, for example between processors, etc.

The solution of the encoding problem consists in that the channel encoder further comprises an external encoder which executes an external encoding with an efficiency $R_1$, the binary redundancy of the encoding for protecting the channel encoder being distributed between the internal encoder and the external encoder so that the internal and external concatenated encodings ensure a global encoding efficiency $R = R_1.R_2$.

Symmetrically, the solution of the decoding problem consists in that the channel decoder comprises, in series with the internal decoder(s), at least one external decoder, the internal and external decoders decoding the protection encoding distributing the said binary redundancy between a concatenated internal encoding and a concatenated external encoding.

Thus, advantageously, the combination of an encoded modulation with concatenated codes allows the encoding efficiency of the transmission to be raised, without raising the transmission rate and consequently without broadening the band. This constitutes a compromise between high-performance transmission and reasonable complexity of the encoding system.

To avoid losing spectral efficiency the redundancy is distributed between an external error-correcting code and an internal code combined with the modulation.

For certain applications, in particular the transmission of digital television signals by satellite, the digital signals are delivered to the channel encoder by a source encoder which brings about a reduction in throughput.

To obtain a spectral efficiency of k bits/s/Hz, it is common to operate an encoding of k with k+1 bits and to use a modulation with $2^{k+1}$ states. By concatenating two codes with global efficiency $R = R_1.R_2$, it is possible in the same way to operate an encoding of k with k+1 bits by distributing the redundancy over both codes.

More precisely, to obtain a global encoding efficiency $R = \frac{3}{4}$, (that is, 3 information bits per redundancy bit, this being a common aim), the channel encoder operates a concatenation of codes through an external encoder with efficiency $R_1 = 6/7$ followed by an internal encoder with efficiency $R_2 = \frac{7}{8}$. The external encoder operates a block encoding which corrects the error packets and the internal encoder operates a convolutive encoding combined with the modulator. The global encoding with efficiency $R = R_1.R_2 = \frac{3}{4}$ has 25% added redundancy which is transmitted through the redundancy of the alphabet of the modulator. Globally for each block, the external encoder adds 1 protection bit per 6 information bits ($R_1 = 6/7$). Similarly the internal encoder adds 1 protection bit to the 7 preceding bits ($R_2 = \frac{7}{8}$). On input to the modulator there are therefore 8 encoded bits including 2 redundancy bits. For the HDTV application in which it is desired to transmit 3 information bits per (27 MHz) clock period T, two periods T, namely 2T, are therefore necessary to transmit the 6 information bits, that is to say 8 encoded bits.

A 16 QAM modulation with two dimensions (I,Q) allows 4 bits to be transmitted per character period. By multiplexing two two-dimensional 16 QAMs it is thus possible to transmit two 4-bit characters placed in series in the course of the 2T period. The internal encoder will thus comprise a convolutive encoder followed by an allocation module for the two 16 QAMs. Advantageously, this allows the redundancy of a concatenated encoding to be transmitted without reducing the useful binary throughput, this being so for a fixed band. Owing to the use of a 4-dimensional 16 QAM the equivalent binary redundancy (for each internal and external code) per character-period T (that is to say ½ bit per character-period) is reduced relative to that of the preceding codes (1 bit per character-period). With two 16 QAM characters constituting one block, there is thus available a redundancy of 1 bit per block-period inserted by the internal encoding. It is thus possible to use this reduction in redundancy to insert it into the external encoding.

At the receiving end the decoding device will possess a symmetrical structure.

Preferably the internal decoder comprises a maximum likelihood decoder. The latter comprises:
 a detection module which determines for each block received a point belonging to that subset of the multidimensional constellation which is closest to the said received block,
 and a Viterbi decoder which operates on the sequences of the said points.

The performance of the encoded modulations depends essentially on the minimum Euclidian distance (dE) of the code used. The same is true for the error-correcting codes for which the Hamming distance (dH) is involved. Hence, the performance of a system with two concatenated codes depends essentially on the product of their distances $d = d_E.d_H$. The internal code maximises the minimum Euclidian distance and the external code maximises the Hamming distance. All of this is of interest in the invention owing to the use of a 4-dimensional 16 QAM (that is to say two 2-dimensional 16 QAMs). In fact the Euclidian distance $d_E$ of a single convolutive code with efficiency 6/7 combined with a 4-dimensional encoded modulation is certainly less than the minimum Euclidian distance obtained using a single convolutive code with efficiency $\frac{3}{4}$ combined with a 2-dimensional 16 QAM (with equivalent complexity) (for example according to the cited document by G. UNGERBOECK). However, as the global distance for the concatenated system is the product of the distances for the subcodes, advantageously d is then much greater than the minimum Euclidian distance $d_E$ of a code with efficiency $\frac{3}{4}$ combined with a 2-dimensional 16 QAM.

To remove the $k\pi/2$ phase ambiguity which may exist when using a QAM, it is possible, in certain cases, to make available the phase information with the aid of an appropriate phase restorer. However, generally this possibility does not exist and according to the invention this $k\pi/2$ phase ambiguity is preferably removed with the aid of an internal encoder which performs an encoding which is invariant to $k\pi/2$ phase rotations of the sequences transmitted. The latter solution is effected according to the invention through a differential encoding prior to the convolutive encoding. The internal encoder thus comprises a differential encoder followed by a convolutive encoder.

Symmetrically when the condition of rotational invariance has been processed on transmission, the internal decoder comprises, after the maximum likelihood decoder, a differential decoder which performs the inverse of the operation performed on transmission.

The rotational invariance of the encoding is manifested by the fact that information present at the input of the internal encoder may undergo $k\pi/2$ phase rotations without the information obtained at the output of the internal decoder being affected thereby.

The external encoder is preferably determined as a function of the solutions (limiting the error rates) adopted on reception for operating the decoding of the data received. This determination takes account of the type of errors liable to appear after internal decoding. Thus, if a Viterbi decoder, at the output of which the errors are correlated, is adopted for the internal decoding, it is then desirable for the external encoder to operate a block encoding able to allow the correcting of error packets on reception. For this purpose the external encoder comprises in series a Reed-Solomon encoder RS1, an interlacer 1, a Reed-Solomon encoder RS2 and an interlacer 2. The interlacers are inserted so that, on reception, deinterlacers executing inverse functions are used to decorrelate the error packets so as to make then smaller and to thus facilitate their correction by a decoder of Reed-Solomon type.

On reception the signals can be processed by an external decoder which comprises two deinterlacers and two Reed-Solomon decoders. Preferably, a single Reed-Solomon decoder is used to execute both decoding tasks. In fact, it may be supposed that the channel is not necessarily always noisy and that intervals of time exist in which no error appears. To decode the signals encoded on transmission by two consecutive encoding operations of Reed-Solomon type it is therefore possible to take advantage of these intervals of time and to use only a single Reed-Solomon decoder executing both decodings. This requires priority management between the two decodings. The purpose of the deinterlacers is to match the error packets to the correction capability of the Reed-Solomon decoder whilst decorrelating the error packets.

It is also possible according to the invention to use other encoded modulations, for example a PM phase modulation (called PSK modulation).

BRIEF DESCRIPTION OF THE DRAWINGS

The invention will be better understood with the aid of the following figures given by way of non-limiting examples, and which represent.

DETAILED DESCRIPTION OF PREFERRED EMBODIMENTS OF THE INVENTION

Figure 1A:
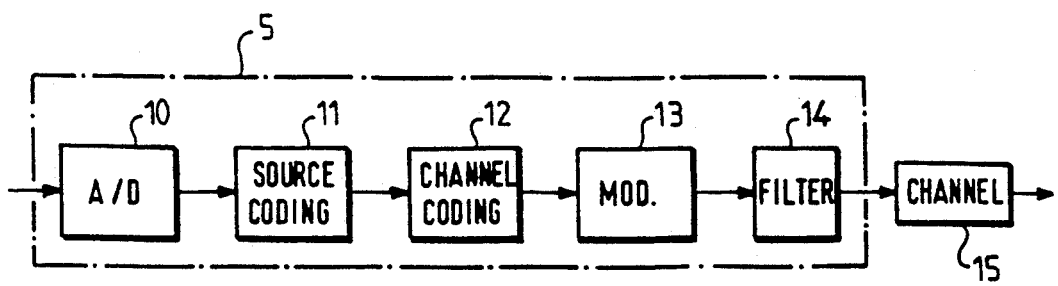
FIG. 1A: a block diagram of a system for modulating and encoding digital signals.

FIG. 1A represents a block diagram of a device 5 for encoding digital signals as it appears in the transmitting part of a modulation/demodulation system. It comprises in series:

a source 10, for example an analog-digital converter, which delivers the digital signals to be encoded when they are not already available in digitised form, a source encoder 11 (which may not be present), a channel encoder 12, a modulator 13, a transmission filter 14.

The encoding device is connected to the transmission channel 15. This may involve radio connections or cable connections.

For an application of HDTV signal transmission with a binary throughput of the samples of the video signal of 864 Mbits/s, this binary throughput is reduced to 81 Mbits/s at the output of the source encoder 11. These samples are encoded by the channel encoder 12 so as to make them insensitive to the imperfections of the channel. The modulator 13 next matches the digital samples to the transmission channel, for example a satellite channel. The redundancy added (relative to an equivalent uncoded modulation) by the channel encoder 12 is transmitted through the redundancy in the alphabet of the modulation.

Figure 1B:
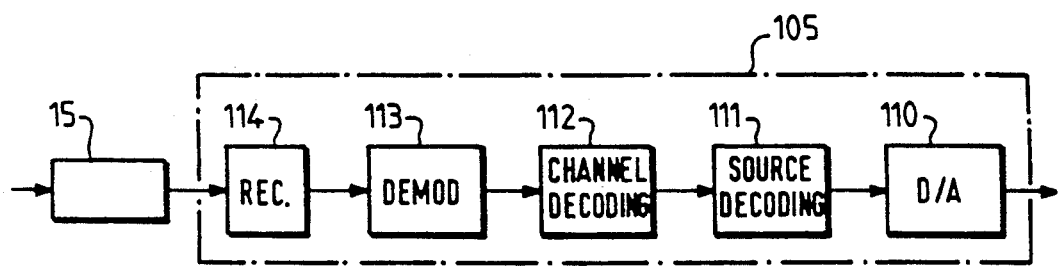
FIG. 1B: a block diagram of a system for demodulating and decoding digital signals.

FIG. 1B represents the block diagram of a decoding device 105 which, on reception, performs the operations inverse to those performed on transmission. For this purpose it comprises (at the output of the channel 15):

a reception filter 114, a demodulator 113, a channel decoder 112, a source decoder 111 (which may not be present), a digital-analog converter 110 when the digital signals are used in analog form.

The encoding device 5, the decoding device 105 and the transmission channel 15 constitute a system for modulating/demodulating digital signals with encoded modulation.

Encoding

Figure 2:
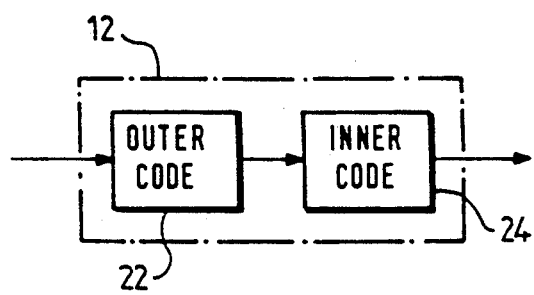
FIG. 2: a block diagram of a channel encoder according to the invention.

According to the invention, the channel encoder 12 represented diagrammatically in FIG. 2 comprises an external encoder 22 placed on the digital signal source 10 side and an internal encoder 24 placed on the modulator 13 side.

According to the invention a concatenation of two codes is performed, preferably:
- an external code which is a block code allowing error packets to be corrected upon decoding on reception,
- an internal code which is a convolutive code combined with the modulator.

The following part is expanded upon, by way of example in the case of an HDTV application. In order to have available for example a spectral efficiency of 3 bits/s/Hz, it is common to use a protection encoding adding 1 redundancy bit, this being manifested by a efficiency $R = \frac{3}{4}$. In this regard the article by M. T. LYONS et al. entitled "16-QAM and trellis-coded 16-QAM on nonlinear channels" IEEE GLOBECOM, NEW ORLEANS, LA. USA, 1985, page 493, may be consulted. By concatenating two codes according to the invention, it is possible to obtain this efficiency $R = \frac{3}{4}$, for example by concatenating respective codes with efficiency $R_1 = 6/7$ and $R_2 = \frac{7}{8}$ (the redundancy is then distributed over 2 characters). Other distributions are also possible, for example $R_1 = 9/10$ and $R_2 = 10/12$. It is also possible to perform a concatenation of several codes, for example three codes, such that $R_1 = 9/10$, $R_2 = 10/11$ and $R_3 = 11/12$ (in both these cases the redundancy is distributed over 3 characters). The redundancy is then distributed over several characters of the block. In these latter two examples the modulation thus changes from 4-dimensional to 6-dimensional. This distribution makes it possible to operate on the complexity and performance of the system.

The external encoder 22 delivers a code which globally adds 1 protection bit to all the 6 information bits ($R_1 = 6/7$). The internal convolutive encoder 24 similarly globally adds 1 redundancy bit to these 7 bits ($R_2 = \frac{7}{8}$) encoded by the external encoder 22. Thus at the input of the modulator 13, 8 encoded bits appear, 2 bits of which represent the redundancy. To transmit the 8 encoded bits, in accordance with the invention a 4-dimensional 16 QAM modulation is used. Thus at the output of the modulator 13, two two-dimensional 16 QAM characters (4 bits correspond to one 16 QAM character) are obtained over a period 2 T. These two characters (2 T) are next placed in series in order to be transmitted.

Figure 3:
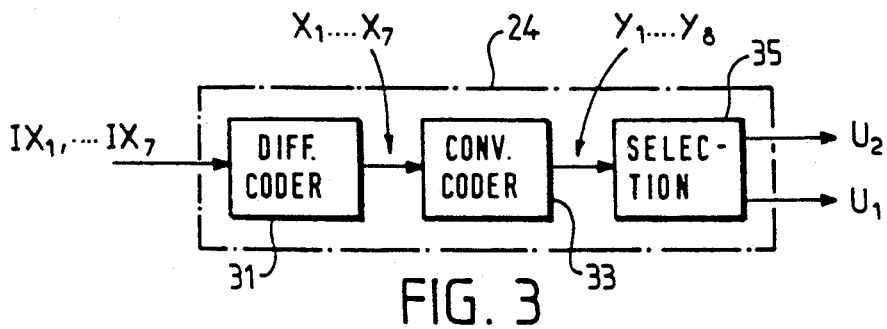
FIG. 3: a block diagram of an internal encoder according to the invention.

FIG. 3 gives the diagram in its most general form of an internal encoder 24 which comprises:
- a differential encoder 31, a convolutive encoder 33 and an allocation module 35.

Figure 4:
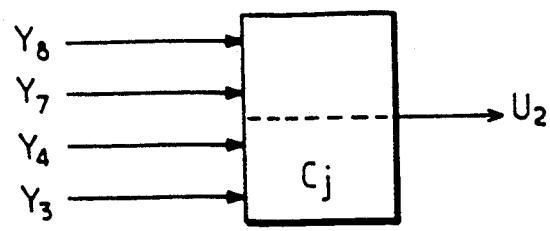
FIG. 4: a block diagram representing the allocation of blocks of two characters $U_1$, $U_2$ in a 4-dimensional constellation.
Figure 4:
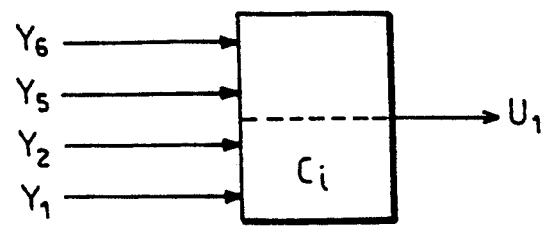

The purpose of the differential encoder 31 is, after decoding, to make the input bits ($IX_1, \ldots, IX_7$) invariant to $k\pi/2$ phase rotations of the transmitted sequence. This encoder may not be present when the problem of rotational invariance does not arise, for example when a phase restorer is present. The output bits ($X_1, \ldots, X_7$) of the differential encoder 31 are next encoded by the 8-state convolutive encoder 33 with efficiency $\frac{7}{8}$. The 8 output bits ($Y_1, \ldots, Y_8$) select the block $U_1, U_2$ in the 4-dimensional constellation denoted $A_0^{(4)}$, with the aid of an allocation module 35. This allocation is represented in FIG. 4. The 4 bits $Y_1, Y_2, Y_5$ and $Y_6$ (respectively $Y_3, Y_4, Y_7$ and $Y_8$) determine the first character $U_1$ of the block (respectively the second character $U_2$) following the binary allocation given by FIG. 5. Among these bits, the two (low order) bits $Y_2, Y_1$ (respectively $Y_4, Y_3$) select the subset $C_i$ ($i = 0,1,2,3$) (respectively $C_j$) of the second level of partition of the constellation $A_0$ which corresponds to $U_1$ (respectively to $U_2$). The two remaining bits $Y_6, Y_5$ (respectively $Y_8, Y_7$) determine the character $U_1$ (respectively $U_2$) in $C_i$ (respectively $C_j$). The allocation module may consist of a PROM.

Figure 5:
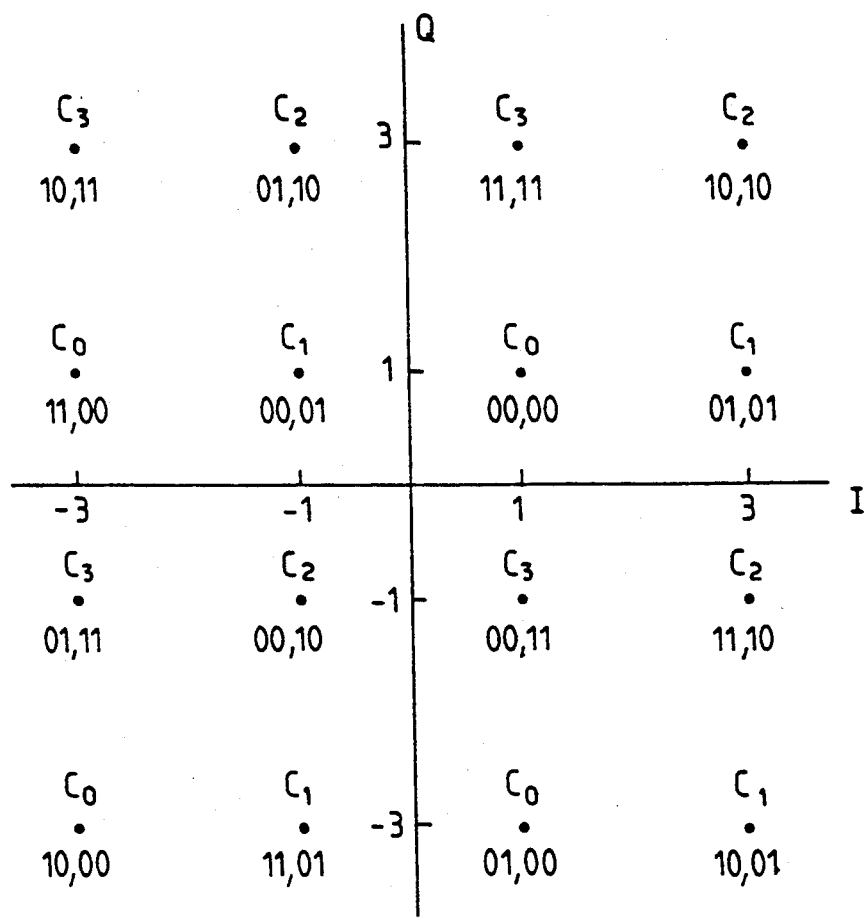
FIG. 5: a representation of a 2-dimensional 16 QAM encoded constellation with binary allocation of characters.

The binary allocation of the characters of the complete 16 QAM constellation $A_0$ is represented in FIG. 5. Calling I and Q the phase and quadrature components respectively of the 2-dimensional 16 QAM constellation, the binary allocation generates 4 disjoint subsets $C_0$, $C_1$, $C_2$ and $C_3$. The table of correspondence between the characters of the constellation and the binary allocation is as follows:

| I | Q | binary allocation |
|---|---|---|
| - subset $C_0$ | | |
| 1 | 1 | 00,00 |
| 1 | −3 | 01,00 |
| −3 | 1 | 11,00 |
| −3 | −3 | 10,00 |
| - subset $C_1$ | | |
| −1 | 1 | 00,01 |
| −1 | −3 | 11,01 |
| 3 | 1 | 01,01 |
| 3 | −3 | 10,01 |
| - subset $C_2$ | | |
| −1 | −1 | 00,10 |
| −1 | 3 | 01,10 |
| 3 | −1 | 11,10 |
| 3 | 3 | 10,10 |
| - subset $C_3$ | | |
| 1 | −1 | 00,11 |
| 1 | 3 | 11,11 |
| −3 | −1 | 01,11 |
| −3 | 3 | 10,11 |

The two low-order bits indicate the subsets $C_0$, $C_1$, $C_2$ and $C_3$. The first low-order bit indicates the first level of partition of the complete constellation $A_0$:
- "0" if the character belongs to the subset $B_0$ with $B_0 = C_0$ or $C_2$,
- "1" if the character belongs to the subset $B_1$ with $B_1 = C_1$ or $C_3$.

The second low-order bit corresponds to the second level of partition of the complete constellation $A_0$:
- "0" if the character belongs to $C_0$ or $C_1$,
- "1" if the character belongs to $C_2$ or $C_3$.

The setting-up of such an allocation is executed with the aim of maximising the minimum Euclidian distance. Calling $d_0$ the minimum Euclidian distance in $A_0$, a value $d_1 = \sqrt{2}.d_0$ is obtained in the subsets $B_0$, $B_1$ and a value $d_2 = \sqrt{2}.d_1$ in the subsets $C_0$, $C_2$ and $C_3$.

Figure 6:
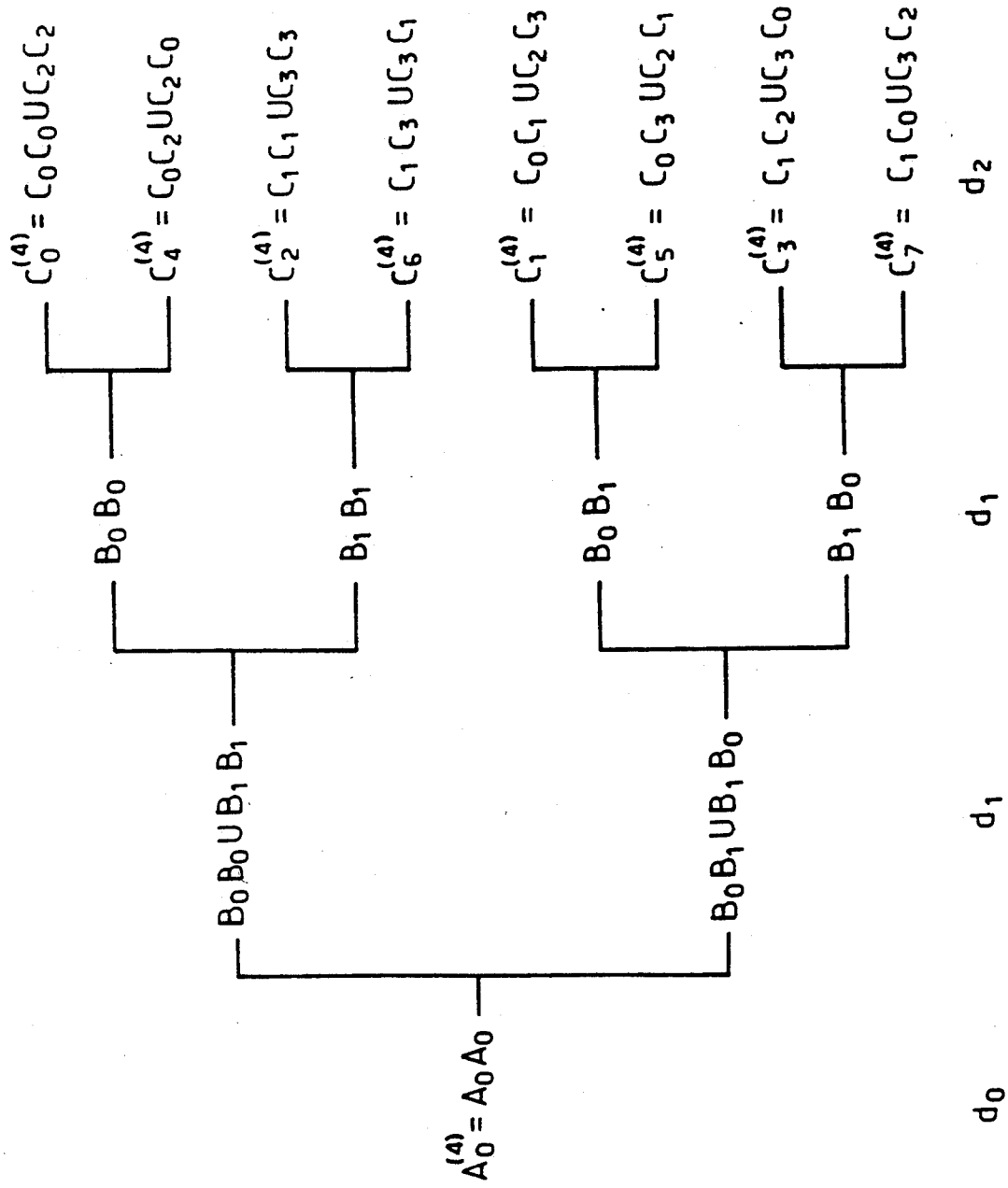
FIG. 6: a representation of the partitioning of a 4-dimensional QAM constellation.

The construction of the code is determined whilst taking account of the partition of the 4-dimensional constellation denoted $A_0^{(4)} = A_0.A_0$ defined by the set of blocks with two characters each belonging to a 2-dimensional 16 QAM constellation ($A_0$). The partition of $A_0^{(4)}$ is based on the second level of partition of $A_0$. It is given by FIG. 6. The minimum Euclidian distances of the 3 levels of partition are respectively $d_0$, $d_1$ and $d_2$ where $d_1 = \sqrt{2}d_0$, $d_2 = 2d_0$, $d_0$ being the minimum Euclidian distance in $A_0$. At the third level of the partition, the 8 subsets $C_i^{(4)}$, $i=0$ to 7 with minimum Euclidian distance $d_2$, are obtained, satisfying:

$$d_{2min}^2(UC_i^{(4)}, \text{i even}) = d_{2min}^2(UC_i^{(4)}, \text{i odd}) = d_1^2$$

where U is the mathematical "union" character.

To set up the structure of the convolutive encoder it is firstly necessary to determine those of its input bits which require an encoding taking account of the partitioning desired at the output. According to FIGS. 5 and 6 it is seen that, in order to select a subset of the form $C_i C_j$ at the output of the convolutive encoder, 2 bits are needed to select $C_i$ and 2 bits to select $C_j$. Thus by encoding the low-order bits it is possible to distinguish one of the sets (for example $C_0.C_0$ encoded 0000) from the other sets which are of the form $C_i.C_j$. With one block being formed by two characters belonging respectively to two constellations $A_0$, the convolutive encoder must therefore deliver 4 encoded bits (the 2 low-order bits corresponding to each of the 2 characters $U_1$ and $U_2$) on its 8 output bits. Hence, four bits are not encoded (the 2 high-order bits of each character). They are therefore the same at the input of the convolutive encoder. With the latter being provided in order to furnish an efficiency $R_2 = \frac{7}{8}$, it is deduced therefrom that 3 input bits must be encoded. The uncoded bits at the output are:

first constellation: $Y_8$, $Y_7$ are respectively identical to $X_7$, $X_6$ at the input, second constellation: $Y_5$, $Y_6$ are respectively identical to $X_4$, $X_5$ at the input.

The 4 encoded bits at the output $Y_1$, $Y_2$, $Y_3$ and $Y_4$ emanate from the 3 input bits $X_1$, $X_2$ and $X_3$.

Figure 7:
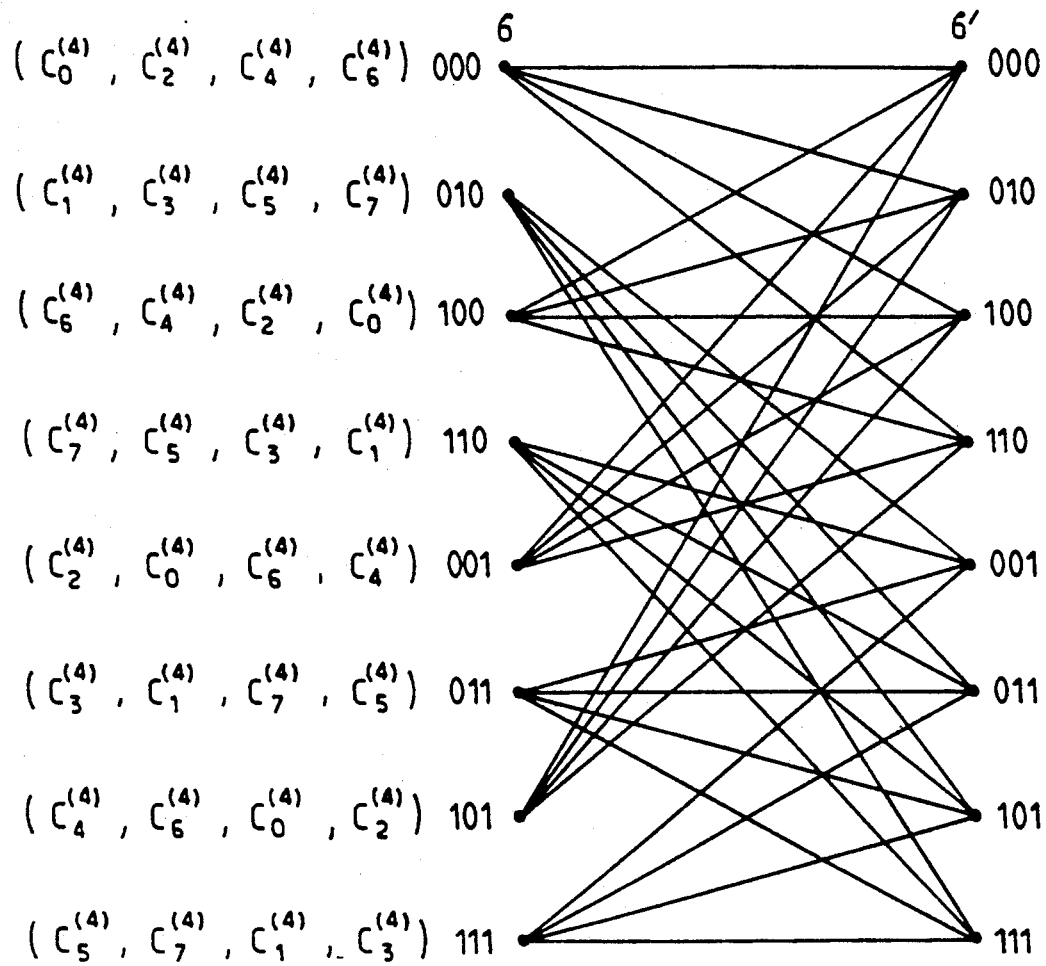
FIG. 7: a representation of the trellis of the convolutive code.

The determining of the structure of the convolutive encoder which carries out this encoding calls upon methods known to the expert, among which may be cited that described by G. UNGERBOECK in the document already cited. One solution for satisfying the condition of minimum Euclidian distance equal to $d_2$ between the parallel branches of the trellis of the code consists in delaying $X_1$ by two block-periods and in delaying $X_2$ by one block-period. By considering the transitions which are present on the signals $X_2D$, $X_1D$, $X_1D^2$ respectively (where D is a delay operator), the trellis represented in FIG. 7 is obtained. This trellis represents the transitions between two successive states $\sigma$, $\sigma'$ (where $\sigma$ is the present state of the encoder defined by $\sigma = (X_2D, X_1D, X_1D^2)$, and $\sigma'$ the future state.

The subsets $C_i^{(4)}$ with even or odd indices are allocated to the four transitions diverging from one state or converging towards one state, this allowing a minimum Euclidian distance of $d_1$ to be ensured between the transitions.

Thus, the minimum distance of the code is equal to $d_2$, namely a saving in minimum distance of 6 dB relative to an uncoded modulation with minimum distance $d_0$.

At each node $\sigma$, for example the node 000, the subsets $C_0^{(4)}$, $C_2^{(4)}$, $C_4^{(4)}$ and $C_6^{(4)}$ are allocated to the transitions, that is to say:

transition from 000 to 000 allocated to $C_0^{(4)}$
transition from 000 to 010 allocated to $C_2^{(4)}$
transition from 000 to 100 allocated to $C_4^{(4)}$
transition from 000 to 110 allocated to $C_6^{(4)}$.

The encoded bits $Y_1$, $Y_2$, $Y_3$ and $Y_4$ depend on the encoded bits $X_1$, $X_2$ and $X_3$ at the input of the encoder, and on the state of the encoder (memory of the encoder), hence on the output of the 3 registers placed at $X_2$ and $X_1$, that is to say on $X_2D$, $X_1D$ and $X_1D^2$.

Figure 8:
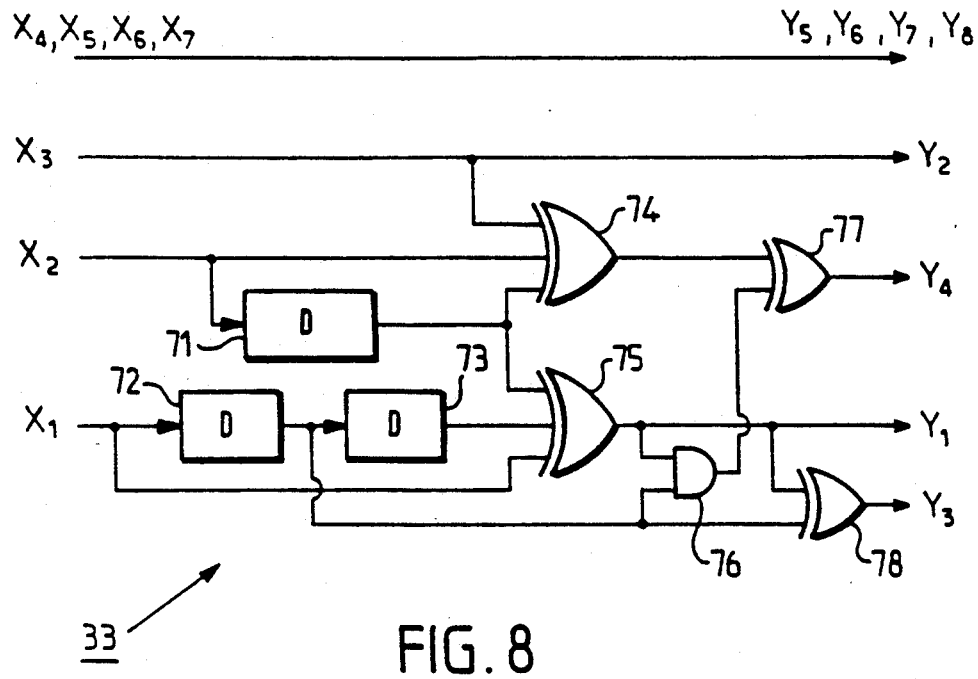
FIG. 8: a diagram of a convolutive encoder with efficiency ⅔ according to the invention.

FIG. 8 represents the diagram of a convolutive encoder with efficiency $\frac{7}{8}$ in which the 3 bits $X_1$, $X_2$ and $X_3$ are encoded and the 4 bits $X_4$, $X_5$, $X_6$ and $X_7$ are not encoded. The bits $Y_2$, $Y_1$ and $Y_4$, $Y_3$ select the subsets $C_i$ and $C_j$ of the constellation $A_0$ corresponding to the characters $U_1$ and $U_2$ respectively. The uncoded bits $Y_6$, $Y_5$ and $Y_8$, $Y_7$ select $U_1$ and $U_2$ in $C_i$ and $C_j$ respectively. The encoder is nonlinear, defined according to the known method through the equations:

$Y_1 = X_2D * X_1D^2 * X_1$
$Y_2 = X_3$
$Y_3 = X_2D * X_1D * X_1D^2 * X_1$
$Y_4 = X_3 * X_2 * X_2D * X_1D.[X_1 * X_1D^2 * X_2D]$
$Y_k = X_{k-1}$, $k = 5, 6, 7, 8$ where the symbol * represents the "exclusive OR" function, and the symbol (.) represents the AND function.

The convolutive encoder 33 comprises:

a first delay-operator 71 operating on $X_2$ a second delay-operator 72 operating on $X_1$ a third delay-operator 73 operating on $X_1$ delayed an exclusive OR gate 74 which receives: $X_3$, $X_2$ and $X_2$ delayed an exclusive OR gate 75 which receives: $X_2$ delayed, $X_1$ and $X_1$ delayed twice, and which delivers $Y_1$, an AND gate 76 which receives $X_1$ delayed once and the output from the gate 75, an exclusive OR gate 77 which receives the outputs from the 2 gates 74 and 76 and which delivers $Y_4$, an exclusive OR gate 78 which receives the outputs from the gates 75 and 72 and which delivers $Y_3$.

The input bits $X_4$, $X_5$, $X_6$ and $X_7$ are uncoded and become the bits $Y_5$, $Y_6$, $Y_7$ and $Y_8$ respectively at the output of the encoder. The bit $X_3$ becomes the bit $Y_2$.

At this juncture in the determination of the structure of the encoder it is necessary to take account of the problem of rotational invariance of the code. It is seen in FIG. 5 that this code is not invariant to $k\pi/2$ phase rotations but it satisfies the rotational transparency condition (see below). As was indicated previously, certain applications may benefit from a phase restoration for which the problem of rotational invariance does not arise. However, other applications, such as the transmission of HDTV pictures on a satellite channel, require that the phase ambiguity be removed. The present example being of this nature, in the allocation of the subsets $C_i^{(4)}$ of the constellation indicated in FIG. 7, this occurrence of the $\pi/2$ phase rotation translates into a modification of this allocation according to Table I.a.: $C_i^{(4)}$ is transformed into $f(C_i^{(4)})$ TABLE I.a

| $C_i^{(4)}$ | $f(C_i^{(4)})$ |
| --- | --- |
| $C^{(4)}$ | $C_2^{(4)}$ |
| $C_1^{(4)}$ | $C_3^{(4)}$ |
| $C_2^{(4)}$ | $C_0^{(4)}$ |
| $C_3^{(4)}$ | $C_1^{(154)}$ |
| $C_4^{(4)}$ | $C_6^{(4)}$ |
| $C_5^{(4)}$ | $C_7^{(4)}$ |
| $C_6^{(4)}$ | $C_4^{(4)}$ |
| $C_7^{(4)}$ | $C_5^{(4)}$ |

So as to make the code invariant to $k\pi/2$ rotations it is then necessary to precede the convolutive encoder with a differential encoder which reestablishes this rotational invariance property for the information bits at the output of the differential decoder.

To ensure that the rotational transparency is satisfied, a function $g(\sigma)$ is defined which is applied to the states $X_2D$, $X_1D$, $X_1D^2$. For this purpose, $g(\sigma)$ is defined such that $g(\sigma)=(X_2D, X_1D, X_1D^2)$ in which only the bit $X_2D$ of $\sigma$ has been inverted, as indicated in Table I.b.

TABLE I.b

| $\sigma = [X_2D, X_1D, X_1D^2]$ | | | $g(\sigma)$ | | |
|---|---|---|---|---|---|
| 0 | 0 | 0 | 1 | 0 | 0 |
| 0 | 0 | 1 | 1 | 0 | 1 |
| 0 | 1 | 0 | 1 | 1 | 0 |
| 0 | 1 | 1 | 1 | 1 | 1 |
| 1 | 0 | 0 | 0 | 0 | 0 |
| 1 | 0 | 1 | 0 | 0 | 1 |
| 1 | 1 | 0 | 0 | 1 | 0 |
| 1 | 1 | 1 | 0 | 1 | 1 |

Rotational transparency is demonstrated in the following way. The trellis of FIG. 7 indicates the transitions from a state $\sigma$ to a state $\sigma'$. The $\pi/2$ rotations (represented by the function f) transform the subsets $C_i^{(4)}$ into $f(C_i^{(4)})$ as indicated in Table I.a.

Let there be an arbitrary transition from $\sigma$ into $\sigma'$. After rotation a state $g(\sigma)$ corresponds to the state $\sigma$. After rotation a state $g(\sigma')$ corresponds to the state $\sigma'$. Rotational transparency exists when the transition which changes $g(\sigma)$ into $g(\sigma')$ also forms part of the trellis and corresponds to the subset $f(C_i^{(4)})$ obtained from $C_i^{(4)}$ after a rotation by $\pi/2$. This rotational transparency condition is necessary to ensure rotational invariance. It is ensured by the trellis of FIG. 7.

With the rotational transparency condition being satisfied, to ensure rotational invariance it suffices to differentially encode the 7 input bits $X_1$ to $X_7$.

In accordance with the considerations expanded upon previously, the uncoded bits $X_4$, $X_5$, $X_6$ and $X_7$ which emanate from the bits $Y_5$, $Y_6$, $Y_7$ and $Y_8$ (high-order bits) are invariant to rotations by $k\pi/2$ (see FIG. 5). Hence, the differential encoding need only be applied to the encoded bits $X_1$, $X_2$ and $X_3$.

In accordance with Table I.b, $f(\sigma)$ which relates to the state after a rotation by $\pi/2$, shows that the bit $X_1$ is not affected by the rotations. In fact, in both parts of this table there are bits which are identical before and after rotation for the operations bearing on $X_1$, that is to say $X_1D$ and $X_1D^2$. As the bit $X_2$ is inverted after a rotation by $\pi/2$ it is necessary to encode it differentially. If between a state $X_1$ at a given instant and an earlier state $X_2D$, the bits relating to these states are the same, this condition is made to correspond to the datum $IX_2=0$ (at the input). If the bits relating to these states differ, this condition is made to correspond to the datum $IX_2=1$ (at the input). This gives the differential encoding defined by:

$$X_2 = IX_2 * X_2D$$

with $IX_2 \rightarrow$ input bit
$X_2 \rightarrow$ output bit.

The differential encoding of the bit $X_3$ is carried out in the following manner. In accordance with FIG. 8, the bit $X_3$ is identical to the bit $Y_2$ which affects only the character $U_1$ (first character of the block). The bit $Y_2$ is the second low-order bit (starting from the right) in FIG. 5 ($Y_2=0$ if $U_1$ belongs to $C_0$ or $C_1$, $Y_2=1$ if $U_1$ belongs to $C_2$ or $C_3$). By performing a $k\pi/2$ rotation, it is seen that the subset $C_i$, $i=0,1,2,3$ is transformed into $C_{(i+k)mod.4}$ (FIG. 5). Thus, for example, the subset $C_0$ becomes $C_1$ after a rotation by $\pi/2$.

By allocating the subsets $C_i$ (respectively $C_{i^-}$) to the character $U_1$ (respectively the character $U_1$ delayed, $U_{1^-}$), the differential encoding of the bit $X_3$ is defined such that:

$IX_3=0$ if $i=i^-$ or $i=(i^- +1)$ mod.4
$IX_3=1$ if $i=(i^- +2)$ mod.4 or $i=(i^- +3)$ mod.4
that is, $X_3 = IX_3 * X_3D * Y_1 . Y_1D$
in order to ensure rotational invariance.

$IX_3 \rightarrow$ input bit
$X_3 \rightarrow$ output bit
$Y_1 \rightarrow$ first low-order bit corresponding to the first character of the block ($U_1$).

After this differential encoding $IX_3$ becomes invariant. In fact, a rotation by $k\pi/2$ of the transmitted sequence increments the indices i and $i^-$ by the same value k.mod 4 and consequently the bit $IX_3$ remains unchanged. It is the difference in the indices i which contains the datum. As $Y_2=X_3$, $X_3$ is the bit allocated to the second level of the partition of $A_0$ and corresponds to the first character $U_1$ of the block, that is to say:

$X_3=0$ if $U_1$ belongs to $C_0$ or $C_1$
and
$X_3=1$ if $U_2$ belongs to $C_2$ or $C_3$.

Figure 9:
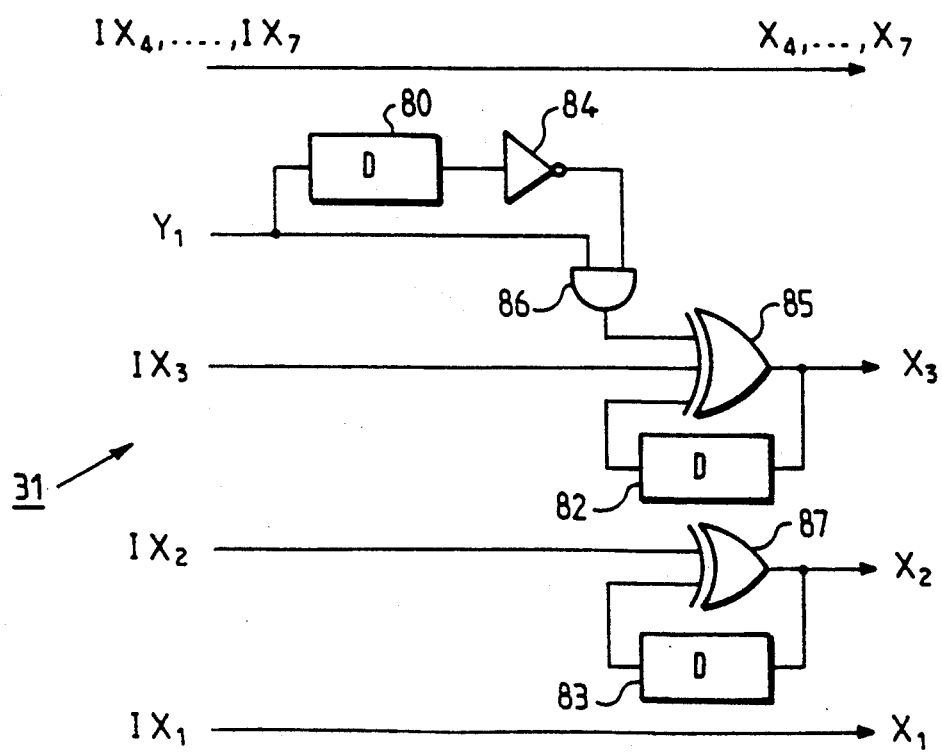
FIG. 9: a diagram of a differential encoder delivering an invariant encoding according to the invention.

The diagram of the differential encoder is given in FIG. 9. It comprises:

a first delay-operator 80 operating on $Y_1$ (output from the convolutive encoder) followed by an inverter 84, a second delay operator 82 operating on the output $X_3$, a third delay operator 83 operating on the output $X_2$, an AND gate 86 which receives $Y_1$ and the output from the inverter 84, an exclusive OR gate 85 which receives the output from the AND gate 86, the output from the delay-operator 82 and the input $IX_3$ and which delivers the encoded bit $X_3$, an exclusive OR gate 87 which receives the output from the delay-operator 83 and the input $IX_2$, and which delivers the encoded bit $X_2$.

The inputs $IX_1$, $IX_4$, $IX_5$, $IX_6$ and $IX_7$ are not encoded and correspond to the output bits $X_1$, $X_4$, $X_5$, $X_6$ and $X_7$ respectively.

Figure 10:
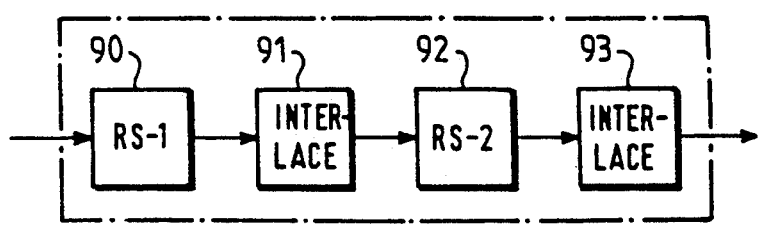
FIG. 10: a block diagram of an external encoder with efficiency 6/7 according to the invention.

An external encoder 22 with efficiency 6/7 is arranged ahead of the internal encoder 24 just described. It globally adds one redundancy bit to 6 information bits. It comprises (FIG. 10) in series a first Reed-Solomon encoder 90, a first interlacer 91, a second Reed-Solomon encoder 92 and a second interlacer 93 which delivers the encoded bits. The choice of these encoders lies in their capability to correct error packets on reception. These encoders are in themselves of known type and will not be detailed here. These Reed-Solomon codes are for example described in "Theory and practice of error control codes", R. BLAHUT, Addison-Wesley Publishing Company, May 1984. For HDTV applications it is for example possible to use a first code RS1 with length N1=52 characters among which K1=48 characters represent the information characters. Each character of this code possesses q=7 bits. This choice is related to the fact that, on reception, it is important to use a single internal Viterbi decoder which delivers characters of 7 bits. The second code RS2 is for example a code with length N2=56 characters among which K2=52 characters represent the information characters. Each character of this code possesses q=7 bits.

Each of these two codes is capable of correcting two error characters. The interlacers 91 and 93 are block interlacers. They allow the error packets to be decorrelated so as to facilitate correction of them on reception by a single Reed-Solomon decoder. This consists firstly in writing into, row by row, and in reading from, column by column, a table with dimensions I×I, symbols of q=7 bits. This table can be stored in a RAM. At the output of the encoder the information characters have a well-determined position in the sequence of N characters. The N-K control characters come first, followed by the K information characters. The code words may be obtained through a polynomial multiplication between a generating polynomial g(x) and an information polynomial inf(x).

By way of example, for an HDTV transmission on a 27 MHz satellite channel, the external encoder 22 (FIG. 2) receives characters with a throughput of 81 Mbits/s at a character frequency of 11.57 MHz (7 bits per character). At the output of the first Reed-Solomon encoder 90 (FIG. 10), the throughput is 87.75 Mbits/s at a character frequency of 12.53 MHz (7 bits per character). At the output of the second Reed-Solomon encoder 92, the throughput is 94.5 Mbits/s with a character frequency of 13.5 MHz (7 bits per character). At the output of the convolutive encoder 33 (FIG. 3) the throughput is 108 Mbits/s at a character frequency of 13.5 MHz (8 bits per character). Thus at the output of the allocation module the two characters $U_1$, $U_2$ are available and are transmitted in succession by the modulator, at the frequency of 27 MHz. The global spectral efficiency is:

$$\frac{81 \text{ Mbits/s}}{27 \text{ MHz}} = 3 \text{ bits/s/Hz}.$$

In accordance with what has just been set out, the expert can set up other binary allocations of a 2-dimensional constellation $A_0$ and other partitions of a 4-dimensional constellation $A_0^{(4)}$ and set up a convolutive code and if necessary a differential code which, when they are concatenated with an external code, make it possible to have a large minimum Euclidian distance while respecting, if necessary, rotational invariance.

Decoding

Figure 11:
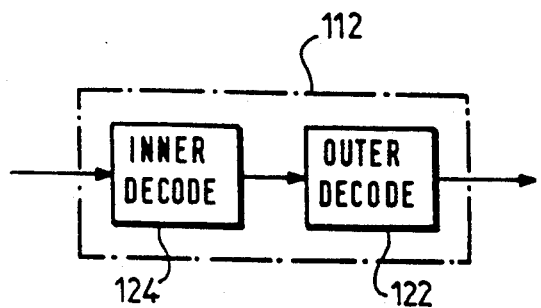
FIG. 11: a block diagram of a channel decoder executing the deconcatenation of the codes according to the invention.

To execute the deconcatenation of the codes concatenated on transmission by the external encoder and the internal encoder of the channel encoder, it is necessary to have available at the receiving end, in series, an internal decoder 124 and an external decoder 122 forming the channel decoder 112 (FIG. 11).

To extract the information, the external decoder 122 performs operations inverse to those performed in the encoding by two Reed-Solomon encoders RS1 and RS2. The Reed-Solomon decoding operation for correcting errors is based on tests. The purpose of these tests is to detect errors in the "code words" received. When no error exists, the information is extracted from the code word, by virtue of the special structure of the latter (the information characters have a well-determined position in the code word). If the word received is erroneous, it is sent to the Reed-Solomon decoder so as to correct the errors. The Reed-Solomon decoder thus delivers the corrected "code word" and the information is then extracted from the corrected "code word". Two tests are performed:

a test TST1 to detect errors in the received words encoded by RS1, a test TST2 to detect the errors in the received words encoded by RS2.

When errors are detected in the received words emanating from the encoding RS1, operation of the Reed-Solomon decoding is performed to correct the errors. Similarly, when errors are detected in the received words emanating from the encoding RS2, operation of the Reed-Solomon decoding is performed to correct the errors.

In certain intervals of time, no error is detected in the words received from RS1 (respectively RS2). In these cases the Reed-Solomon decoder, instead of being left "dormant", can correct in these intervals of time the possible errors detected in RS2 (respectively RS1).

As was specified earlier, it is not therefore necessary to endow the external decoder with a structure entirely symmetric with that of the external encoder. In particular, although the external encoder uses two Reed-Solomon encoders RS1 and RS2, at the receiving end it is possible to use just a single Reed-Solomon decoder by taking advantage of these intervals of time in which no error appears. For example, for a BER = $10^{-4}$ at the output of the internal decoder, the decoding of the code RS2 uses only 2% of the time (error rate $\simeq$ 1 block out of 50) and the decoding of the code RS1 uses only 0.065% of the time (error rate $\simeq$ 1 block out of 1538). A single decoder is therefore sufficient, but management of addressing and of decoding priority proves to be necessary since the BER for the blocks received from the code RS2 is greater than the BER for the blocks received from the code RS1. The decoding of RS1 therefore takes priority over the decoding of RS2 if the two words received are "simultaneously" erroneous. To make the decoding of the codes RS1 and RS2 function in parallel, the strategy adopted here is to handle the macroblocks of n code words with a priority management. The choice of n depends on minimising the probability of having several simultaneously erroneous consecutive blocks of words of codes RS1 and RS2.

Calling $n = n1 + n2$ where n1 = number of consecutive erroneous blocks of code RS1, n2 = number of consecutive erroneous blocks of code RS2 n must be chosen such that:

$$P_1^{n1} + P_2^{n2} \leq P$$

where $P_1$ represents the probability of errors in the blocks of RS1, $P_2$ represents the probability of errors in the blocks of RS2.

If we choose $P = 10^{-15}$ and BER = $10^{-4}$, then:

$$n2 \geq 9, n1 \geq 5, \text{ hence } n1 + n2 \geq 14.$$

Therefore n = 14 may be chosen in order to execute the decoding of the signals corresponding to the constraints set out previously in the example chosen. This choice for the value of n means that no conflict of correction will arise if the words received are "simultaneously" corrupted with errors in both codes.

Figure 12:
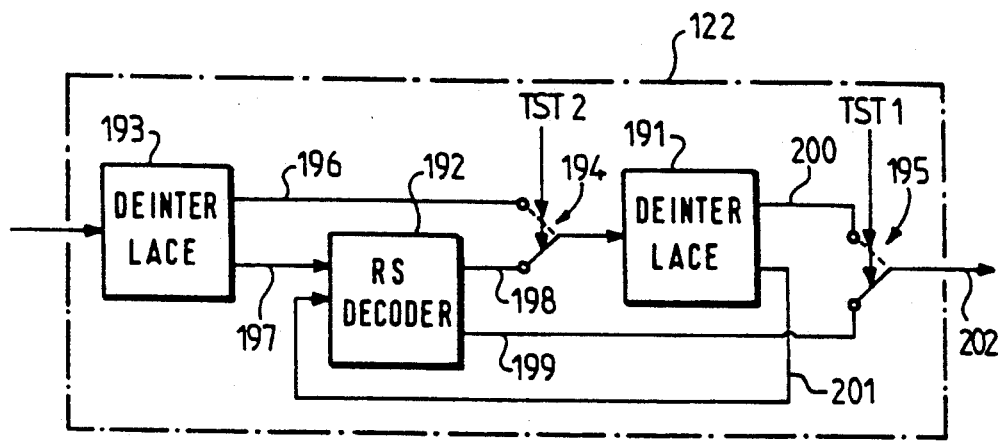
FIG. 12: a block diagram of an external decoder.

The block diagram of the external decoder 122 is represented in FIG. 12. It comprises a first stage 193 which performs a first deinterlacing followed by a Reed-Solomon decoder 192, then by a second stage 191 which performs a second deinterlacing. More precisely it comprises:

a first stage 193 which performs, for the first encoding, a first deinterlacing and which separates from one another first erroneous blocks 197 and first correct blocks 196, a first test module which determines a number of first erroneous blocks and which delivers a test signal TST2, a Reed-Solomon decoder 192 which receives the said first erroneous blocks 197 from the first stage and supplies first corrected blocks 198, a first switch 194, controlled by the signal TST2, which switches the said first correct blocks 196 and the said first corrected blocks 198 to a second stage 191, a second stage 191 which performs, for the following encoding, a second deinterlacing and which separates from one another second erroneous blocks 201 and second correct blocks 200, the said second erroneous blocks 201 being inserted at the input of the Reed-Solomon decoder 192 which delivers second corrected blocks 199, a second test module which determines a number of second erroneous blocks and which delivers a second test signal TST1, a second switch 195, controlled by the signal TST1, which switches to an output 202 the said second correct blocks 200 and the said second corrected blocks 199, the Reed-Solomon decoder correcting in priority the second erroneous blocks when the first erroneous blocks and earlier second erroneous blocks simultaneously require to be decoded.

Figure 13:
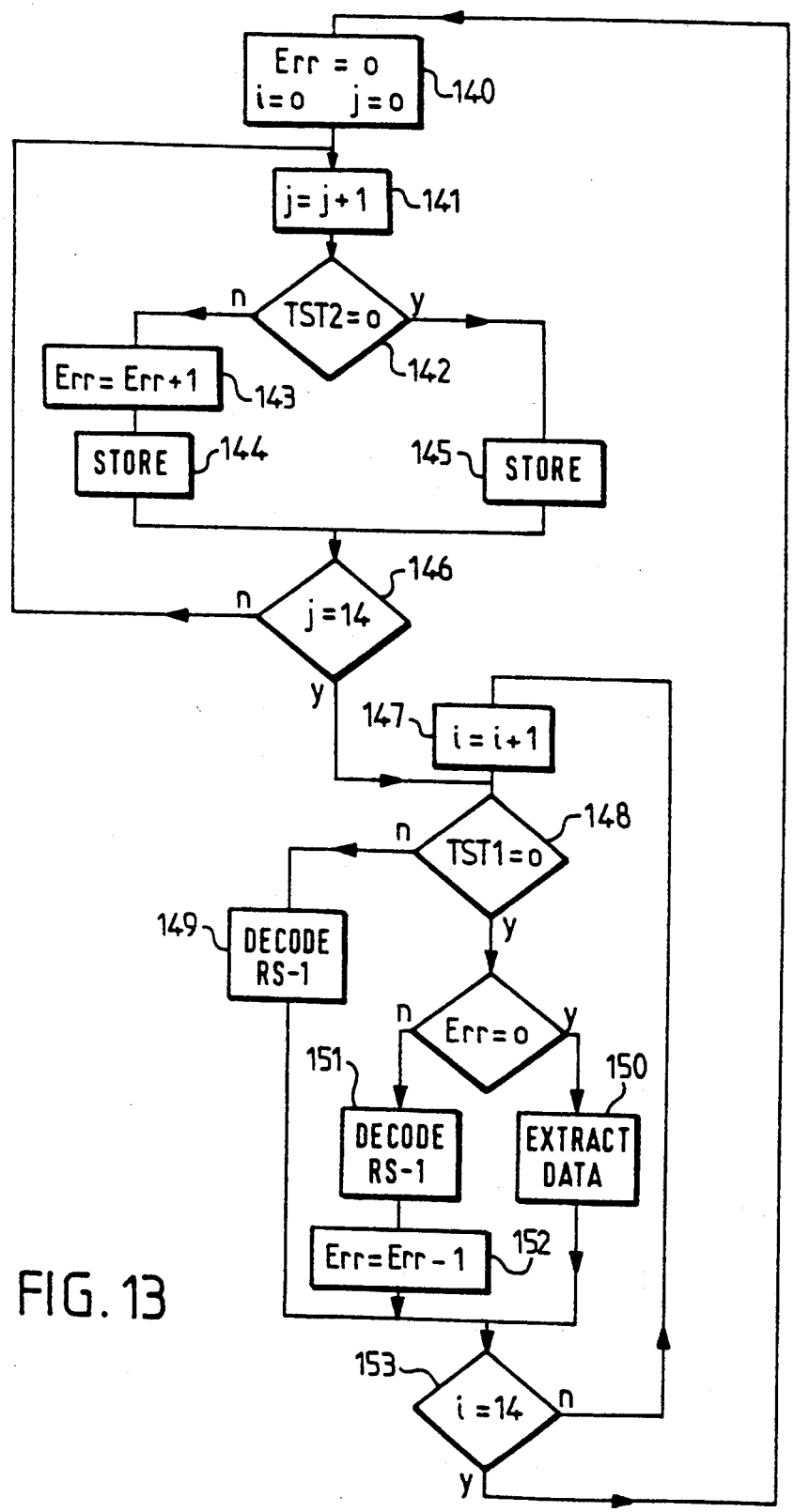
FIG. 13: a flow diagram representing the management of decoding implemented in the external decoder.

Management of priorities is described by the flow diagram of FIG. 13.

step 140 indicates initialisation. 14 blocks are introduced on which the error tests will be performed. Two block counters are initialised (i=0, j=0), relating to loops for two tests, TST1 and TST2. A counter of the number of errors detected is set to zero: Err=0.

A loop relating to a first test is executed.

step 141. The block counter j is incremented by one unit.

step 142. The test TST2 is performed. It consists in detecting according to the code RS2 errors in the blocks received, and for this purpose it determines the result of dividing the word received V(x) by the generating polynomial g(x). If the remainder from the division equals zero, then there is no error (TST2=0, character y). If the remainder from the division differs from zero, then an error is detected (TST2≠0, character n) and the counter of the number of errors is incremented (step 143). The erroneous blocks and the nonerroneous ones are placed in memory (steps 144 and 145 respectively). The test TST2 is executed in this way until all the 14 blocks have been examined (step 146).

A second loop relating to a second test TST1 is then executed.

step 148. The test TST1 relates to the detecting of errors according to the code RS1 also according to a division by a generating polynomial. If errors are detected (TST1≠0, character n), there is priority implementation of the decoding of the code RS1 and extraction of the information from RS2 in the nonerroneous data blocks (step 149), if no error is detected (TST1=0, character y) there is a test to determine the value Err of the number of errors detected during TST2, if Err=0, the information from RS1 and from RS2 is extracted in the nonerroneous data blocks (step 150), if Err≠0, decoding takes place according to the code RS2 and information is extracted according to RS1 (step 151). The value of Err is decremented by one unit (step 152).

Step 153 determines whether all the blocks have been tested (here 14 blocks):

if i≠14 processing continues via step 147 with incrementation of the block counter i, if i=14 processing of the 14 blocks is terminated and another cycle bearing on another batch of 14 blocks is restarted at step 140.

Figure 14A:
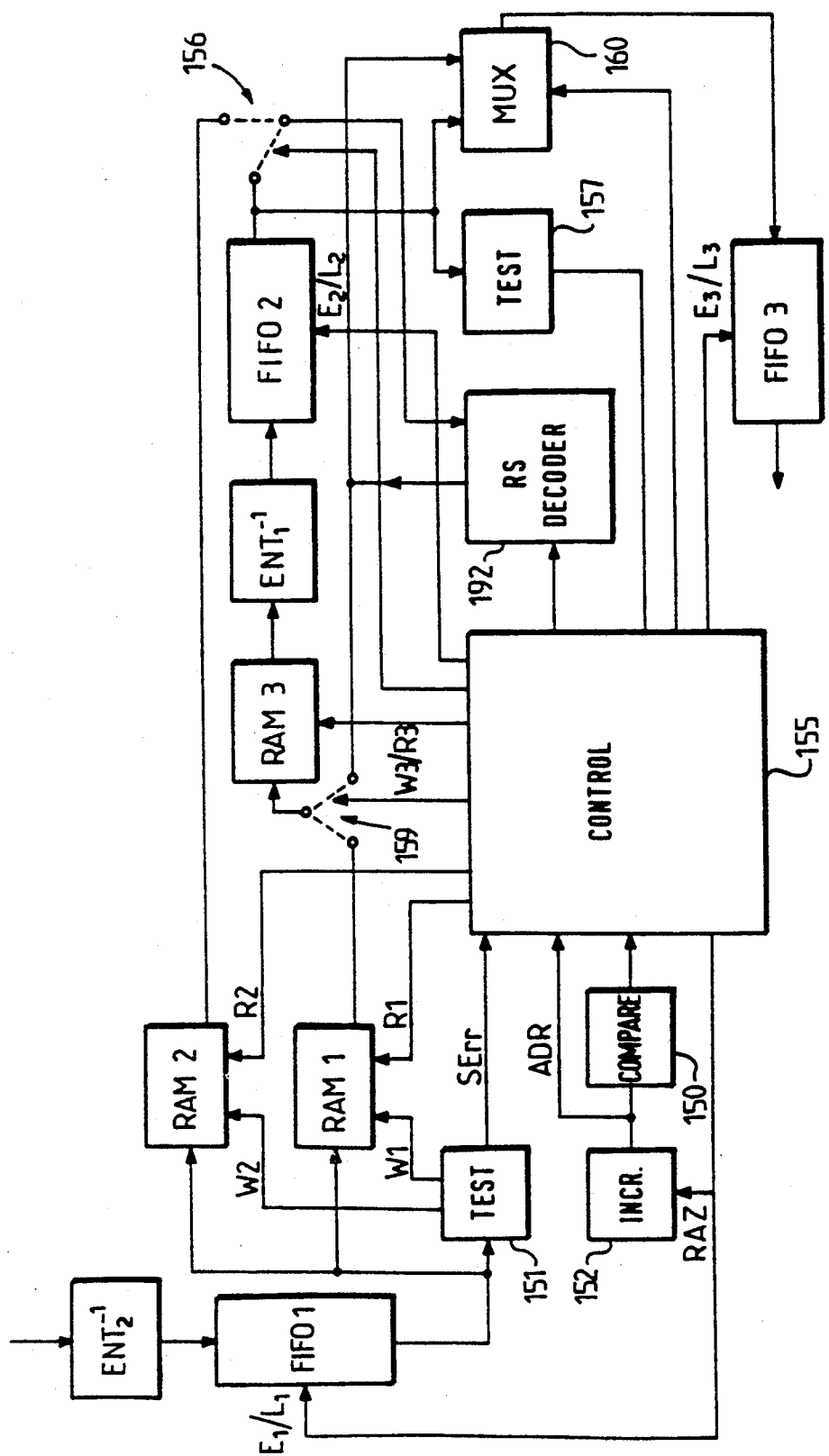
FIG. 14A: a diagram of an external decoder according to the invention.
Figure 14:
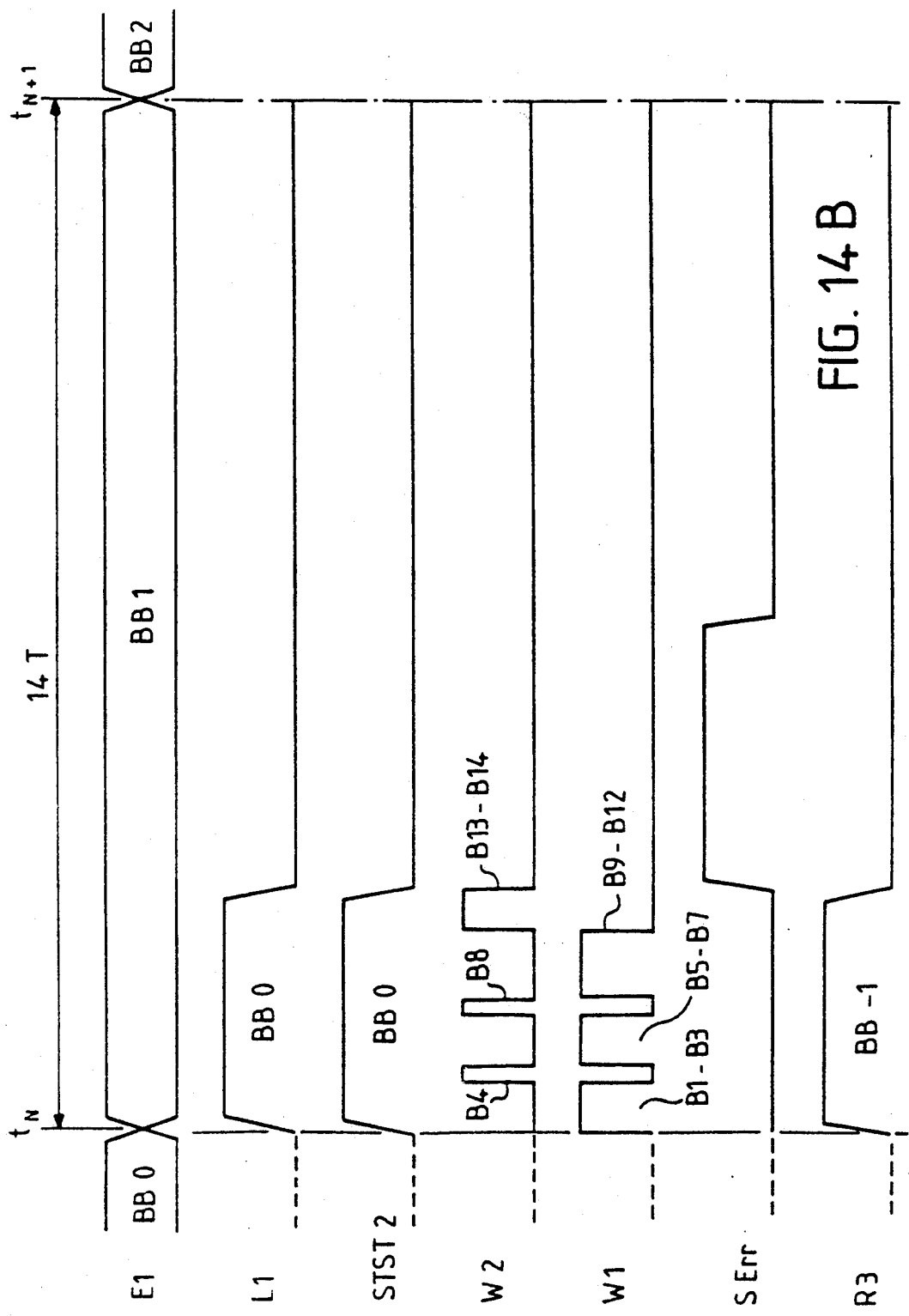
FIGS. 14B, 14C: a timing diagram relating to the diagram of FIG. 14A.

FIG. 14A represents a block diagram of the external decoder corresponding to the management flow diagram of FIG. 13.

At the output of the deinterlacer $ENT_2^{-1}$ (which receives the signals to be decoded) there is a memory FIFO1 which, on each cycle, stores 14 data blocks which are subjected to the test TST2 in the test module 151. Each time, the incrementer 152 counts the number of blocks processed (counter j). The erroneous blocks (TST2≠0) are written (signal W2) to a memory RAM2 and the correct blocks (TST2=0) are written (signal W1) to a memory RAM1. The addresses ADR of the erroneous blocks and of the correct blocks written to the two memories are transmitted by the incrementer 152 to a management unit 155. The latter also receives an error signal SErr which indicates that errors have been detected.

A comparator 150 tests whether the number of blocks (here j=14) has been reached. It then transmits a command to the management unit 155. A single RS decoder 192 is used to operate on the erroneous data. The latter have emanated (switch 156) either from the memory RAM2 which stores erroneous data (after $ENT_2^{-1}$) or from a memory FIFO2 (after $ENT_1^{-1}$). The test module (TST1) 157 enables the switch 156 to be controlled through the management unit 155. A memory RAM3 placed ahead of the deinterlacer $ENT_1^{-1}$ is loaded (signal W3) either with the approved tested data emanating from the memory RAM1, or with the data which were erroneous after the test TST2 (memory RAM2) but which have been corrected by the RS decoder 192. A switch 159 ensures this switching, controlled by the management unit 155. At the end of processing, a multiplexer 160 allows the data which have not undergone correction, and the data which have undergone a correction by the RS decoder 192, to be delivered in the correct order to a memory FIFO3. When the 14 blocks initially placed in the memory FIFO1 have been processed, the management unit 155 transmits a reset to zero signal RAZ to the incrementer 152 and a signal for writing 14 new blocks to the memory FIFO1.

Figure 14C:
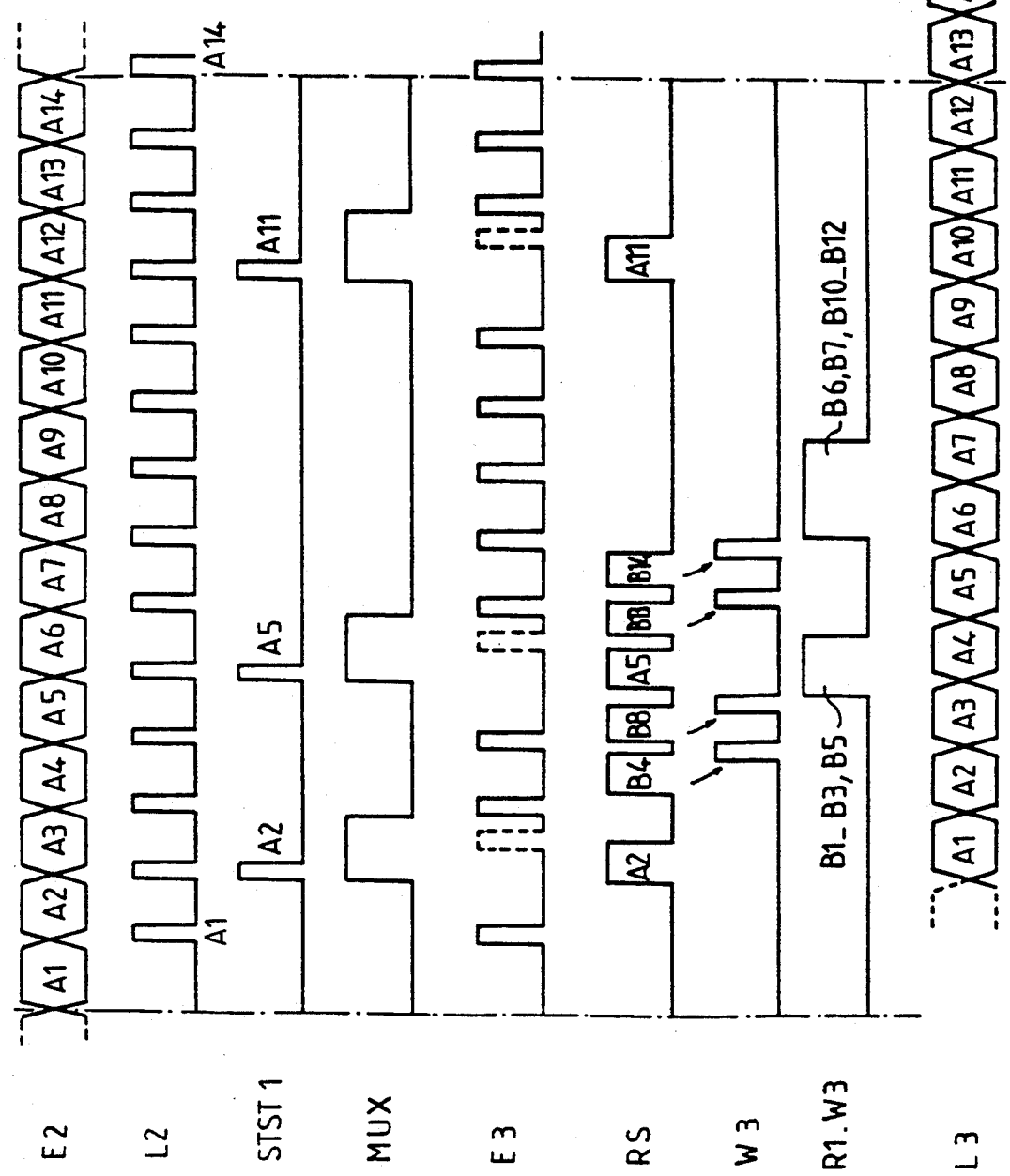

The way in which the data blocks are processed by the external decoder is represented by the timing diagram of FIGS. 14B and 14C. It corresponds to a 14T cycle (between $t_N$ and $t_{N+1}$) where T is the period of a block. The value 14 is taken here by way of example.

From top to bottom in FIG. 14B are:

1—the signal $E_1$ for writing a macroblock BB1 of 14 blocks to the memory FIFO1. The macroblock BB1 is preceded (respectively followed) by a macroblock BB0 (respectively BB2). This writing is done at the frequency $f_{s2}=13.5$ MHz which is the decoding character frequency corresponding to the encoding RS2.

2—the signal L1 for reading the macroblock BB0 from the memory FIFO1. This reading is executed at a frequency f which is higher than the previous one: for example $f=4\times f_{s2}=54$ MHz. For this purpose, the memory FIFO1 is configured in two parts which execute alternately.

3—a test signal STST2 is delivered, with a slight delay relative to the reading signal L1. In the course of this test certain blocks will be tested as correct and others as erroneous.

4—by way of example, blocks $B_4$, $B_8$, $B_{13}$ and $B_{14}$ are tested as erroneous. A write signal $W_2$ is transmitted in order to write them to the memory RAM2.

5—similarly, blocks $B_1$ to $B_3$, $B_5$ to $B_7$ and $B_9$ to $B_{12}$ are tested as correct. A write signal $W_1$ is transmitted in order to write them to the memory RAM1.

6—following this an error signal SErr is transmitted to the management unit 155 in order to implement a decoding procedure (error correction).

7—at the start of the 14T cycle a reading signal R3 is transmitted in order to read the memory RAM3 which contains the correct samples emanating from RAM1 and the corrected samples emanating from the RS decoder. This reading operates on the earlier macroblock $BB_{-1}$ which has undergone part of the processing in the course of the preceding cycle.

The blocks emanating from the memory RAM3 enter the deinterlacer $ENT_1^{-1}$ at a character frequency $f_{s1}=12.53$ MHz. This processing operation which consists, as for the interlacing, in reading from and writing to a table ($I\times I$) lasts a certain number of cycles.

8—at the start of the 14T cycle (indicated in FIG. 14B), the memory FIFO2 receives (FIG. 14C) a signal E2 for writing considerably earlier blocks which have just been deinterlaced. These blocks $A_1$ to $A_{14}$ are represented at the top of FIG. 14C. Again from top to bottom are:

9—a signal L2 for reading the memory FIFO2 at the processing character frequency $f=54$ MHz.

10—a test signal STST1 is delivered with a slight delay relative to the reading signal L2 and allows the erroneous blocks, for example $A_2$, $A_5$ and $A_{11}$, to be determined. The test TST1 benefits from a priority as discussed earlier. These erroneous characters are then switched towards the RS decoder.

11—the RS decoding is performed very rapidly and the multiplexer (signal MUX) allows the characters $A_2$, $A_5$ and $A_{11}$ to be put back after correction into their group of characters (represented dotted on E3).

12—a write signal E3 allows the characters of the blocks $A_1$ to $A_{14}$ to be written to memory FIFO3.

13—these characters can then be read (signal L3) from the memory FIFO3 at a frequency $f_s=11.57$ MHz which is the character frequency at the output of the external decoder. With one character being encoded with 7 bits, a throughput of 81 Mbits/s is obtained.

As indicated previously, the RS decoder serves in the sequential decoding of the code RS1 and of the code RS2. In FIG. 14C the label RS indicates the way in which the erroneous characters emanating from the two codes are nested. With test TST1 taking priority, the characters of type A take priority here and $A_2$ is therefore corrected first. The period between the erroneous blocks $A_2$ and $A_5$ being fairly large, the RS decoder then performs the correction on the blocks $B_4$ and $B_8$ and so on.

After correction, the blocks of type B are written to the memory RAM3 in order to continue the deinterlacing processing $ENT_1^{-1}$. The signal $W_3$ controls the exchanges between the RS decoder and RAM3 and the signal $R_1.W_3$ controls the exchanges between RAM1 and RAM3.

Figure 15:
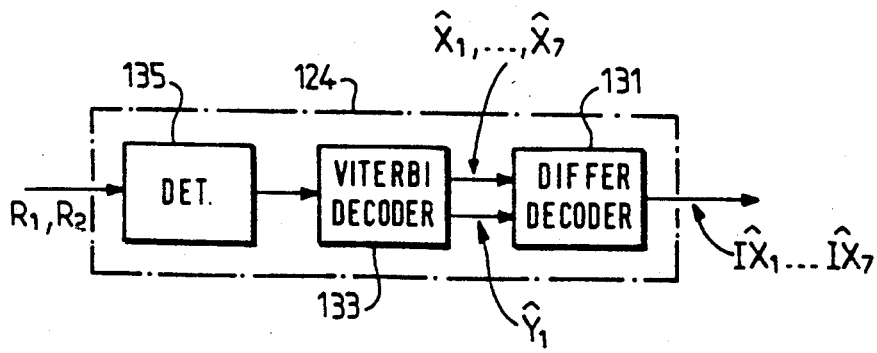
FIG. 15: a block diagram of an internal decoder.

FIG. 15 represents the block diagram of an internal decoder 124 according to the invention. It comprises a detection module 135 which determines the point closest the block received ($R_1$, $R_2$) in each of the subsets $C_i^{(4)}$, $i=0, \ldots, 7$ of the constellation $A_0^{(4)}$. For this purpose it determines the metric of the block received ($R_1$, $R_2$) in each of the 8 subsets, the metric being defined by the square of the Euclidian distance between the block ($R_1$, $R_2$) and the closest point in $C_i^{(4)}$. This operation can be carried out with the aid of a PROM.

The estimated points and the metrics emanating from the detection module 135 are next processed by a maximum likelihood decoder, for example a Viterbi decoder 133. As for the Viterbi encoder, the construction of a Viterbi decoder is known for example from the paper already cited. For the example presented in the invention (convolutive code with 8 states) this requires 32 additions and 24 comparisons per block period. At the output of the Viterbi decoder are obtained estimated data $\hat{X}_1, \ldots, \hat{X}_7$ and $\hat{Y}_1$ with a certain delay. When the signals have been processed by a differential encoder for requirements of rotational invariance, it is then necessary to use a differential decoder 131 to execute the differential decoding and obtain the data $I\hat{X}_1, \ldots, I\hat{X}_7$ at the output.

Considering the illustrative embodiment described for the differential encoding, the differential decoder executes a decoding according to the relations:

$I\hat{X}_2 = \hat{X}_2 * \hat{X}_2D$
$I\hat{X}_3 = \hat{X}_3 * \hat{X}_3D * \hat{Y}_1 . \hat{Y}_1D$
$I\hat{X}_i = \hat{X}_i = 1, 4, 5, 6, 7.$ The symbol * represents the "exclusive OR" function, and the symbol (.) represents the AND function.

Figure 16:
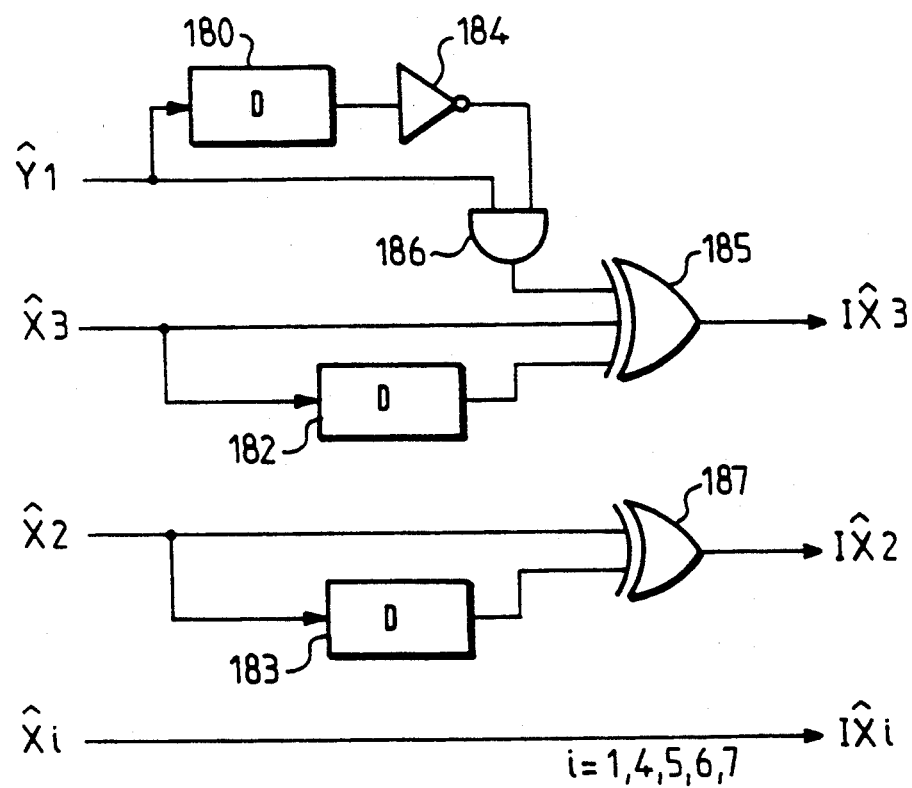
FIG. 16: a diagram of a differential decoder.

The diagram for the differential decoder is given in FIG. 16. It comprises:

a first delay-operator 180 operating on $\hat{Y}_1$ (input of the Viterbi decoder) followed by an inverter 184, a second delay-operator 182 operating on the input $\hat{X}_3$, a third delay-operator 183 operating on the input $\hat{X}_2$, an AND gate 186 which receives $\hat{Y}_1$ and the output from the inverter 184, an exclusive OR gate 185 which receives the output from the AND gate 186, the output from the delay-operator 182 and the input $\hat{X}_3$ and which delivers the decoded bit $I\hat{X}_3$, an exclusive OR gate 187 which receives the output from the delay-operator 183 and the input $\hat{X}_2$, and which delivers the decoded bit $I\hat{X}_2$.

The bits $\hat{X}_1$, $\hat{X}_4$, $\hat{X}_5$, $\hat{X}_6$ and $\hat{X}_7$ are not decoded and are identical to the output bits $I\hat{X}_1$, $I\hat{X}_4$, $I\hat{X}_5$, $I\hat{X}_6$ and $I\hat{X}_7$ respectively.

To decode an external encoding, formed by two Reed-Solomon encodings and two interlacings, with the aid of a single Reed-Solomon decoder, the invention also relates to a decoding method.

The invention also relates to a method of decoding digital signals, implemented in a modulation/demodulation system, the said signals being transmitted according to a modulation encoded by a transmission channel, the said signals having undergone a protection encoding by an addition of binary redundancy distributed over several character-periods of the encoded modulation, the protection encoding comprising an internal encoding combined with the encoded modulation. In the case in which the said system also implements a distribution of the binary redundancy between the internal encoding and an external encoding performed by two Reed-Solomon encodings and two interlacings, the invention is notable in that the method executes according to the following steps:

A1—deinterlacing of first blocks of signals by macroblocks BBi grouping together several first successive blocks, A2—deinterlacing of second blocks of signals by macroblocks AAj grouping together several second successive blocks earlier than the said first blocks BBi, B1—separating of first erroneous blocks and of first correct blocks, B2—separating of second erroneous blocks and of second correct blocks, C1—determining the number of first erroneous blocks to be decoded C2—determining the number of second erroneous blocks to be decoded D—then, on the one hand, decoding either the first erroneous blocks or the second erroneous blocks depending on their order of appearance when they do not arrive simultaneously, and, on the other hand, priority decoding, of the second erroneous blocks when the first and the second erroneous blocks simultaneously require to be decoded E—extracting the first and second correct blocks and the first and second decoded blocks.

We claim:

1. A system for modulating digital signals for transmission using encoded modulation via a transmission channel, said system comprising:

I. a channel encoder having an input for receiving said digital signals, said channel encoder comprising:

a) a first encoder coupled to said input, for executing a first encoding of said digital signals with a first efficiency so as to form first encoded digital signals;

b) a second encoder coupled to said first encoder so as to receive said first encoded digital signals, said second encoder comprising:

a convolutive encoder which receives said first encoded digital signals and subjects them to a convolutive encoding having a second efficiency so as to form second encoded signals; and a binary allocation module comprising modulation information; and II. a modulator coupled to said second encoder for modulating said second encoded signals in accordance with said modulation information;

wherein said channel encoder further comprises means for protecting said digital signals by implementing binary redundancy coding in said first and second encoders so as to distribute the binary redundancy between said first and second encoders so as to ensure a third efficiency for the channel encoder equal to the first efficiency multiplied by the second efficiency.

2. The system according to claim 1, wherein said first efficiency equals 6/7, said second efficiency equals $\frac{7}{8}$ and said third efficiency equals $\frac{3}{4}$.

3. System according to claim 1, characterised in that the convolutive encoder encodes input bits $X_i (i=1$ to 7) with output bits $Y_j (j=1$ to 8) such that the bits $X_3$, $X_4$, $X_5$, $X_6$, $X_7$ become, without encoding, the bits $Y_2$, $Y_5$, $Y_6$, $Y_7$, $Y_8$ respectively, the remaining output bits being encoded by the convolutive encoder which comprises:

a first delay-operator operating on $X_2$ a second delay-operator operating on $X_1$ a third delay-operator operating on $X_1$ delayed a first exclusive OR gate which receives: $X_3$, $X_2$ and $X_2$ delayed a second exclusive OR gate which receives: $X_2$ delayed, $X_1$ and $X_1$ delayed twice, and which delivers $Y_1$ an AND gate which receives $X_1$ delayed once and the output from the second exclusive OR gate a third exclusive OR gate which receives the outputs from the first exclusive OR gate and from the AND gate and which delivers $Y_4$ a fourth exclusive OR gate which receives the outputs from the second exclusive OR gate and from the second delay-operator and which delivers $Y_3$.

4. System according to claim 1, characterised in that the second encoder comprises, ahead of the convolutive encoder, a differential encoder which sets up rotational invariance.

5. System according to claim 4, characterised in that the differential encoder encodes input bits $IX_i (i=1$ to 7) with output bits $X_i (i=1$ to 7) such that the bits $IX_4$, $IX_5$, $IX_6$, $IX_7$ become, without encoding, the bits $X_4$, $X_5$, $X_6$, $X_7$ respectively, the remaining output bits being encoded by the differential encoder which comprises:

a fourth delay-operator operating on $Y_1$ followed by an inverter a fifth delay-operator operating on the output $X_3$ a sixth delay-operator operating on $X_2$ another AND gate which receives $Y_1$ and the output from the inverter a fifth exclusive OR gate which receives the output from another AND gate 86, the output from the fifth delay-operator and the input $IX_3$ and which delivers the encoded bit $X_3$ a sixth exclusive OR gate which receives the output from the sixth delay-operator and the input $IX_2$, and which delivers the encoded bit $X_2$.

6. A system according to claim 1, characterised in that the binary allocation module executes the binary allocation of characters of a constellation according to the following correspondence table, with I and Q representing the phase and quadrature components respectively of the signals representing the characters of the constellation and the binary allocation representing the binary values allocated to I and Q respectively, said binary values being separated by commas:

| I | Q | binary allocation |
|---|---|---|
| - subset $C_0$ | | |
| 1 | 1 | 00,00 |
| 1 | −3 | 01,00 |
| −3 | 1 | 11,00 |
| −3 | −3 | 10,00 |
| - subset $C_1$ | | |
| −1 | 1 | 00,01 |
| −1 | −3 | 11,01 |
| 3 | 1 | 01,01 |
| 3 | −3 | 10,01 |
| - subset $C_2$ | | |
| −1 | −1 | 00,10 |
| −1 | 3 | 01,10 |
| 3 | −1 | 11,10 |
| 3 | 3 | 10,10 |
| - subset $C_3$ | | |

-continued

| I | Q | binary allocation |
| --- | --- | --- |
| 1 | −1 | 00,11 |
| 1 | 3 | 11,11 |
| −3 | −1 | 01,11 |
| −3 | 3 | 10,11 |

7. System according to claim 1, characterised in that the binary redundancy is distributed over two characters emanating respectively from two multiplexed 16 QAMs.

8. System according to claim 1, characterised in that the first encoder comprises, in series, a Reed-Solomon encoder RS1, an interlacer 1, a Reed-Solomon encoder RS2 and an interlacer 2.

* * * * *